(12) United States Patent
Kuriyama (10) Patent No.: US 7,760,251 B2
(45) Date of Patent: Jul. 20, 2010

(54) SOLID-STATE IMAGING DEVICE AND MANUFACTURING METHOD THEREOF

(75) Inventor: Toshihiro Kuriyama, Otsu (JP)

(73) Assignee: Panasonic Corporation, Osaka (JP)

( * ) Notice: Subject to any disclaimer, the term of this patent is extended or adjusted under 35 U.S.C. 154(b) by 1212 days.

(21) Appl. No.: 11/119,763

(22) Filed: May 3, 2005

(65) Prior Publication Data

US 2005/0253044 A1    Nov. 17, 2005

(30) Foreign Application Priority Data

May 11, 2004    (JP)    .............................. 2004-140854

(51) Int. Cl.
*H04N 9/64* (2006.01)
*H04N 3/14* (2006.01)

(52) U.S. Cl. ...................... 348/250; 348/311

(58) Field of Classification Search ................. 348/294; 257/431, 433, 446, 491, 499
See application file for complete search history.

(56) References Cited

U.S. PATENT DOCUMENTS

| | | | |
|---|---|---|---|
| 5,373,179 A | | 12/1994 | Matsui et al. |
| 5,597,758 A | | 1/1997 | Heim et al. |
| 5,670,813 A | * | 9/1997 | Harada et al. ............... 257/355 |
| 5,672,902 A | | 9/1997 | Hatanaka et al. |
| 5,684,323 A | * | 11/1997 | Tohyama ..................... 257/363 |
| 5,742,084 A | * | 4/1998 | Yu ............................. 257/356 |
| 5,834,822 A | | 11/1998 | Hatanaka et al. |
| 5,844,280 A | * | 12/1998 | Kim ............................ 257/355 |
| 7,274,394 B2 | * | 9/2007 | Koizumi et al. .............. 348/294 |
| 2002/0043688 A1 | * | 4/2002 | Van Lieverloo ............. 257/367 |

FOREIGN PATENT DOCUMENTS

| | | |
|---|---|---|
| JP | 6-77406 | 3/1994 |
| JP | 8-64772 | 3/1996 |
| JP | 2569053 | 1/1997 |
| JP | 9-191102 | 7/1997 |
| JP | 11-205686 | 7/1999 |
| JP | 2000-49293 | 2/2000 |
| JP | 2000-114465 | 4/2000 |
| JP | 2000-152090 | 5/2000 |
| JP | 2001-298157 | 10/2001 |
| JP | 3313125 | 5/2002 |
| JP | 2004-55675 | 2/2004 |
| JP | 2004-512685 | 4/2004 |
| WO | 02/33753 | 4/2002 |

OTHER PUBLICATIONS

Chinese Patent Office Action issued May 9, 2008 in a corresponding application.

* cited by examiner

*Primary Examiner*—Ngoc-Yen T Vu
(74) *Attorney, Agent, or Firm*—Wenderoth, Lind & Ponack, L.L.P.

(57) ABSTRACT

The present invention aims to provide a solid-state imaging device that enables miniaturization of camera while maintaining the level of electrostatic damage resistance in the solid-state imaging device, and includes: an imaging unit 100 that transfers signal charge generated by performing photoelectric conversion on incident light, converts the signal charge into an electric signal, and outputs the electric signal as an image signal; and a peripheral circuit portion 110 which includes: a signal electrode pad 111; a power supply electrode pad 112; and a protection circuit 113 that has diodes 320 and 330 placed in opposition, and that discharges static electricity entering from the exterior, to the power supply electrode pad 112.

6 Claims, 9 Drawing Sheets

FIG. 10C

SOLID-STATE IMAGING DEVICE AND MANUFACTURING METHOD THEREOF

BACKGROUND OF THE INVENTION (1) Field of the Invention

The present invention relates to a solid-state imaging device, and in particular, to a solid-state imaging device that can reduce the number of types of electric power and the number of electric terminals.

(2) Description of the Related Art

In general, a charge-coupled device (CCD) solid-state imaging device is used for the solid-state imaging device that composes an imaging device installed in a camera, especially a digital still camera.

Figure 1:
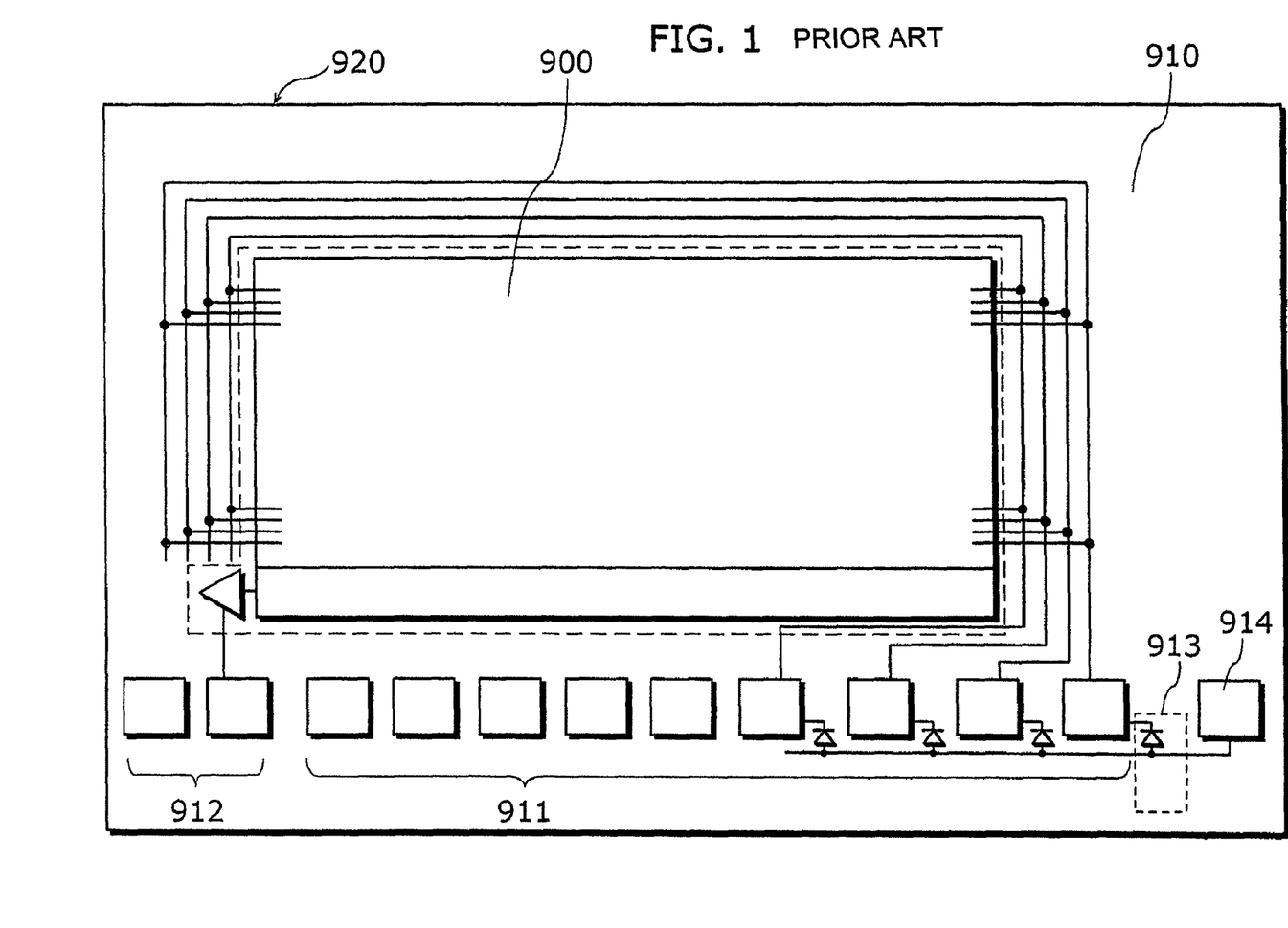
FIG. 1 is a schematic diagram showing a top view of the conventional CCD solid-state imaging device.

FIG. 1 is a schematic diagram showing a top view of a conventional CCD solid-state imaging device (e.g., see reference to Japanese Patent No. 3313125, pp. 1-3 and FIG. 15).

As shown in FIG. 1, the conventional solid-state imaging device has a structure in which an imaging unit 900 for imaging an object, and a peripheral circuit portion 910 are formed in a main surface portion of a semiconductor substrate 920 formed in a chip.

The imaging unit 900 includes, though not shown in the diagram, photodiodes, vertical CCDs, horizontal CCDs and an output amplifier. The imaging unit 900 transfers signal charge generated by performing photoelectric conversion on incident light, converts the signal charge into an electric signal, and outputs the electric signal as an image signal.

The peripheral circuit portion 910 includes: nine signal electrode pads 911 for inputting and outputting signals; two power supply electrode pads 912 for supplying power; a protection circuit 913 for protecting the imaging unit 900 from static electricity that comes in from the exterior; and an electrostatic electrode pad 914 for discharging such static electricity.

The signal electrode pad 911 includes the following electrode pads: an electrode pad to which four-phase pulses of V1, V2, V3 and V4 for driving the vertical CCDs are provided; an electrode pad to which two-phase pulses H1 and H2 for driving the horizontal CCDs are provided; an electrode pad to which a pulse RG, which resets a floating diffusion layer to which signal charge is transmitted from the horizontal CCDs, is provided; and an electrode pad to which a pulse SUB, which sets an overflow barrier for discharging an excess of charge generated in the photodiodes and realizes electronic shutter operation for forcibly discharging the signal charge in the photodiodes, is provided; and an electrode pad for outputting an image signal from the output amplifier.

The power supply electrode pad 912 consists of the following: an electrode pad to which a power voltage Vod such that provided to the output amplifier is provided; and an electrode pad to which a reference voltage Vwell is provided.

A voltage Vss with the level as low as a low level voltage of the pulse V1, V2, V3 or V4 is provided from outside to the electrostatic electrode pad 914.

The protection circuit 913 includes a diode whose anode is connected to the electrostatic electrode pad 914 and whose cathode is connected to any one of the signal electrode pads 911. Such protection circuit 913 discharges, to the electrostatic electrode pad 914, the static electricity that has come into the signal electrode pad 911 from the exterior, and thus protects the imaging unit 900. For example, the protection circuit 913, which is connected to the signal electrode pad 911 to which the pulses V1 to V4 are provided, discharges the static electricity that has come into the signal electrode pad 911 to which the pulses V1 to V4 are provided, and protects a driving electrode in the vertical CCD.

SUMMARY OF THE INVENTION

Figure 2:
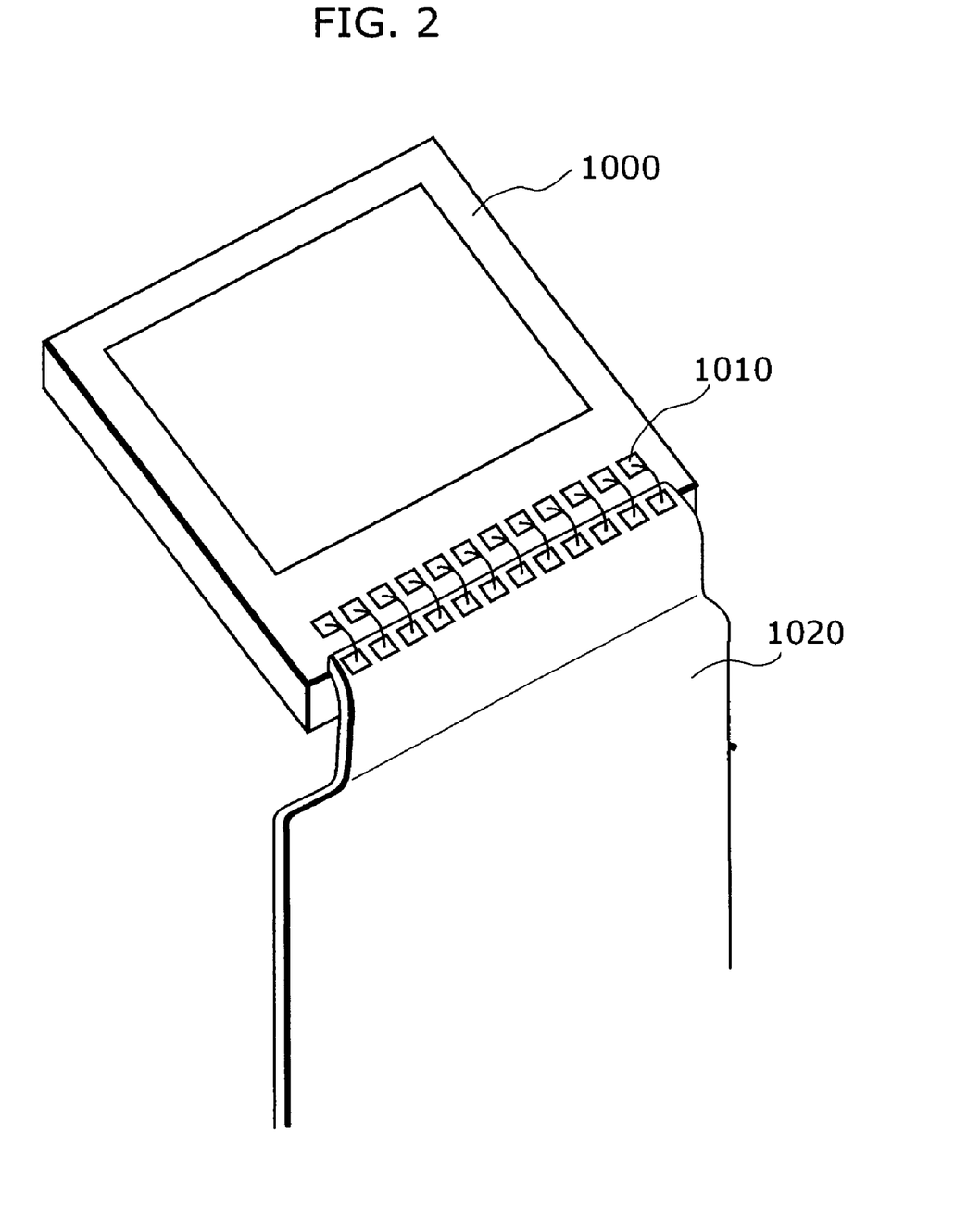
FIG. 2 is diagonal view of a camera equipped in an electronic endoscope.

Recently, further miniaturization of a camera has been requested. In the conventional solid-state imaging device, however, twelve electrode pads, each of which has a width of about 80-100 µm, are formed on a semiconductor substrate at intervals of about 40 µm. The problem therefore is that a planar dimension of the semiconductor substrate and that of a substrate such as a flexible sheet connected to the solid-state imaging device increase, and that it is not possible to meet the demand for the miniaturization of a camera due to the increase. For instance, the solid-state imaging device used for a camera installed in an electronic endoscope has a structure, as shown in FIG. 2, in which electrode pads 1010 are arranged in a row along a specific side of a semiconductor substrate 1000, and the electrode pads 1010 are connected to the electrode pads of a flexible sheet 1020. As a result, the width of the semiconductor substrate 1000 becomes as wide as 1.5 mm.

The present invention is conceived in view of the above problem, and an object of the present invention is to provide a solid-state imaging device that can realize miniaturization of a camera while maintaining the level of electrostatic damage resistance in the device.

In order to achieve the above object, a solid-state imaging device according to the present invention includes: an imaging unit which includes a photoelectric conversion unit operable to photo-electrically convert incident light into signal charge, and is operable (i) to transfer the signal charge generated by the photoelectric conversion unit, (ii) to convert the signal charge into an electric signal, and (iii) to output the electric signal as an image signal; a protection circuit that protects the imaging unit from static electricity; and a power supply electrode pad that supplies the imaging unit with power, wherein the protection circuit discharges static electricity entering from outside, to the power supply electrode pad. The imaging unit may transfer the signal charge, using a pulse having a voltage level of positive or negative, and the power supply electrode pad may be supplied with power having a level equal to or higher than the positive voltage of the pulse. The solid-state imaging device may further include a signal electrode pad for input and output of signal, wherein the protection circuit may include a first diode, and a cathode of the first diode may be connected to the power supply electrode pad while an anode of the first diode may be connected to the signal electrode pad. The signal electrode pad may be supplied with a pulse to be used for transferring signal charge. The protection circuit may be formed in a semiconductor substrate of first conductivity type, and in a part where the protection circuit is formed, the semiconductor substrate may include: a first region of second conductivity type, which is formed in an upper part of the semiconductor substrate, the second conductivity type being a type opposite to the first conductivity type; a second region of first conductivity type, which is formed in a surface portion of the first region and is connected to the power supply electrode pad; and a third region of second conductivity type, which is formed in a surface portion of the second region and is connected to the signal electrode pad.

Thus, it is possible to discharge the static electricity that comes in from the exterior, without installing an electrode pad exclusively used for discharging such static electricity. This realizes the solid-state imaging device that enables miniaturization of a camera while maintaining the level of electrostatic damage resistance in the device. The reduction in the numbers of electrode pads and wirings in the assembly substrate connected to the solid-state imaging device enables further miniaturization of the camera. It is also possible to realize the solid-state imaging device that can reduce the numbers of types of power and terminals.

The protection circuit may further include a second diode, and a cathode of the second diode may be connected to the cathode of the first diode while an anode of the second diode may be connected to a ground.

Thus, the static electricity that has entered the imaging unit can be discharged to the ground so that it is possible to strengthen the level of electrostatic damage resistance in the solid-state imaging device.

A plurality of the first diodes may be connected in parallel, and a plurality of the third regions may be formed in island shape in the surface portion of the second region.

Thus, it is possible to increase the amount of static electricity to be discharged by the protection circuit by increasing the planar dimension of PN junction. Therefore, the level of electrostatic damage resistance in the solid-state imaging device can further be strengthened. Also, by widening a range of selection for the arrangement of diodes, it is possible to realize miniaturization of the solid-state imaging device.

The solid-state imaging device may have an electronic shutter function to forcibly discharge the signal charge generated by the photoelectric conversion unit, wherein in the part where the protection circuit is formed, the semiconductor substrate may include a fourth region of second conductivity type, which is formed below the second region within the first region, and the fourth region has an impurity concentration higher than an impurity concentration of the first region.

Thus, it is possible to eliminate the influence on the protection circuit caused by the operation of electronic shutter.

The photoelectric conversion unit may be formed in the semiconductor substrate, and in the part where the photoelectric conversion unit is formed, the semiconductor substrate may include: the first region of second conductivity type, which is formed in an upper part of the semiconductor substrate; a fifth region of first conductivity type, which is formed in the surface portion of the first region; and a sixth region of second conductivity type, which is formed in a surface portion of the fifth region. In the part where the protection circuit is formed, the semiconductor substrate may further include, a seventh region of second conductivity type, which is formed in a surface portion of the third region, and the sixth and seventh regions may be formed by doping the regions with the same impurity and under the same condition as applied to the fifth and third regions.

Thus, the number of processing required for forming the photoelectric conversion unit and the protection circuit is reduced. Therefore, it is possible to simplify the manufacturing process of the solid-state imaging device.

The solid-state imaging device may further include: a first wiring that connects the protection circuit and the power supply electrode pad; and a second wiring that connects the imaging unit and the power supply electrode pad, wherein the first and second wirings may be separately wired. The power supply electrode pad may be made up of a first electrode pad and a second electrode pad, the first wiring may be connected to the first electrode pad, and the second wiring may be connected to the second electrode pad.

Thus, it is possible to electrically separate the protection circuit from the imaging unit, so that it is possible to prevent fluctuation in the voltage to be supplied to the imaging unit, which is caused by the diving voltage from the protection circuit to the imaging unit.

As is obvious from the above description, with the solid-state imaging device according to the present invention, it is possible to realize the solid-state imaging device that enables miniaturization of a camera while maintaining the level of electrostatic damage resistance in the solid-state imaging device. It is also possible to realize the solid-state imaging device that has a high level of electrostatic damage resistance.

The present invention thus provides the solid-state imaging device that enables miniaturization of camera while maintaining the level of electrostatic damage resistance in the solid-state imaging device, and therefore, its practical value is very high.

FURTHER INFORMATION ABOUT TECHNICAL BACKGROUND TO THIS APPLICATION

The disclosure of Japanese Patent Application No. 2004-140854 filed on May 11, 2004 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT

The following describes the solid-state imaging device according to the present embodiment of the present invention with reference to the diagrams.

Figure 3:
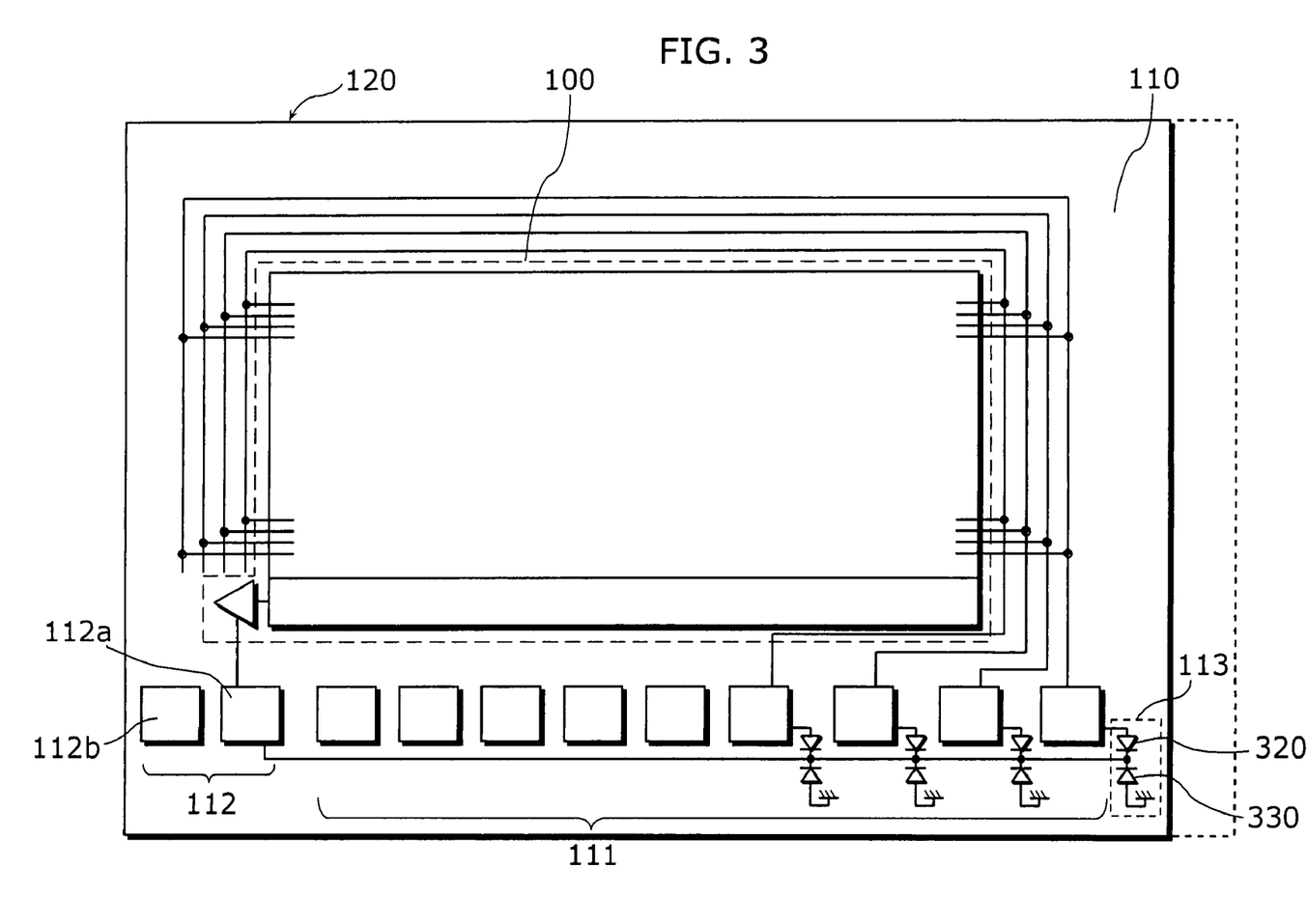
FIG. 3 is a schematic view showing a top view of the CCD solid-state imaging device described in the embodiment of the present invention.

FIG. 3 is a schematic diagram showing a top view of the CCD solid-state imaging device of the present embodiment.

The CCD solid-state imaging device according to the present embodiment has a structure in which an imaging unit 100 for imaging an object and a periphery circuit portion 110 are formed in a main surface portion of semiconductor substrate 120 that is formed in a chip.

The imaging unit 100 includes, though not shown in the diagram, plural photodiodes that are bi-dimensionally arranged for storing signal charge generated as a result of photoelectric conversion, plural vertical CCDs for transferring, in a vertical direction, the signal charge generated by the photodiodes, one or plural horizontal CCDs for transferring, in a horizontal direction, the signal charge transferred from each vertical CCD, and an output amplifier that converts the signal charge transferred from the horizontal CCD(s) into electric signal and that outputs the electric signal as an image signal.

The periphery circuit portion 110 includes: nine signal electrode pads 111 for inputting and outputting signals; two power supply electrode pads 112 for supplying power; and a protection circuit 113 that protects the imaging unit 100 from the static electricity that has entered from the exterior.

The signal electrode pad 111 sets the following: an electrode pad to which four-phase pulses of V1, V2, V3 and V4 for driving each of the vertical CCDs are provided; an electrode pad to which two-phase pulses of H1 and H2 for driving the horizontal CCD(s) are provided; an electrode pad to which a pulse RG that resets a float diffusion layer to which signal charge is transmitted from the horizontal CCD(s) is provided; and an electrode pad to which a pulse SUB, which sets an overflow barrier for discharging an excess of charge generated in the photodiodes and realizes electronic shutter operation for forcibly discharging the signal charge in the photodiodes, is provided; and an electrode pad for outputting the image signal from the output amplifier. The pulses V1 to V4 are pulses, each of which has a voltage at positive or negative level.

Figure 4:
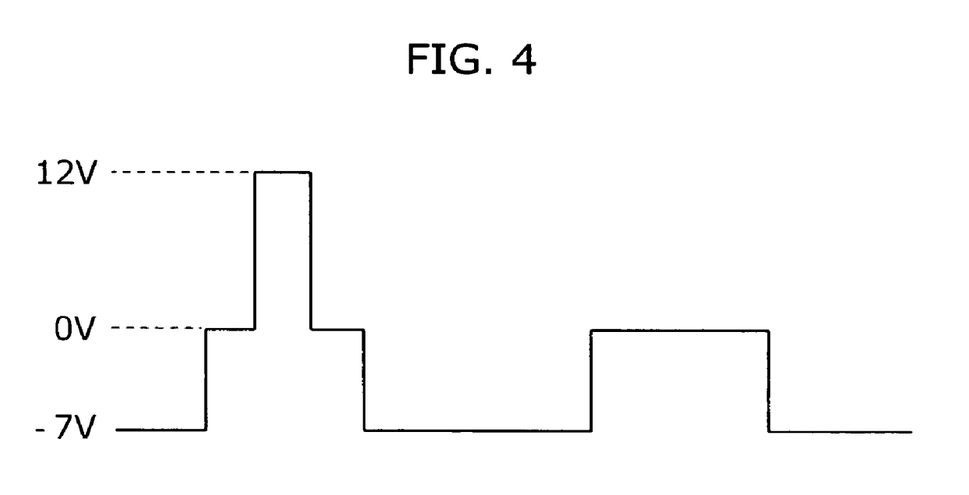
FIG. 4 shows an example of a waveform of a pulse for driving a vertical CCD.

The power supply electrode pad 112 includes a first electrode pad 112a to which a voltage Vod such that supplied to the output amplifier is provided, and a second electrode pad 112b to which a reference voltage Vwell is provided. Here, the voltage Vod is set to have the level as same as or higher than a positive voltage of the pulses V1, V2, V3 or V4. For example, in the case where the pulses V2 and V4 respectively have two values of 0V and −7V and the pulses V1 and V3 respectively have, as shown in FIG. 4, three values of 12V, 0V and −7V, the voltage Vod is set to 12V.

The protection circuit 113 includes the following: a diode 320 whose cathode is connected to the first electrode pad 112a, and whose anode is connected to one of the signal electrode pads 111; and a diode 330 whose cathode is connected to the cathode of the diode 320, and whose anode is connected to the ground. The protection circuit 113 discharges, to the first electrode pad 112a, the static electricity that has entered the signal electrode pad 111 from the exterior. In the case where a large amount of static electricity comes into the signal electrode pad 111, the protection circuit 113 discharges the static electricity also to the ground so as to protect the imaging unit 100. For example, the protection circuit 113, which is connected to the signal electrode pad 111 to which the pulses V1 to V4 are provided, discharges the static electricity that has entered into the signal electrode pad 111 to which the pulses V1 to V4 are provided, and protects a driving electrode of the vertical CCD. Note that the connection between the anode of the diode 330 and the ground can be realized by connecting, for example, the anode of the diode 330 to the second electrode pad 112b.

Figure 5:
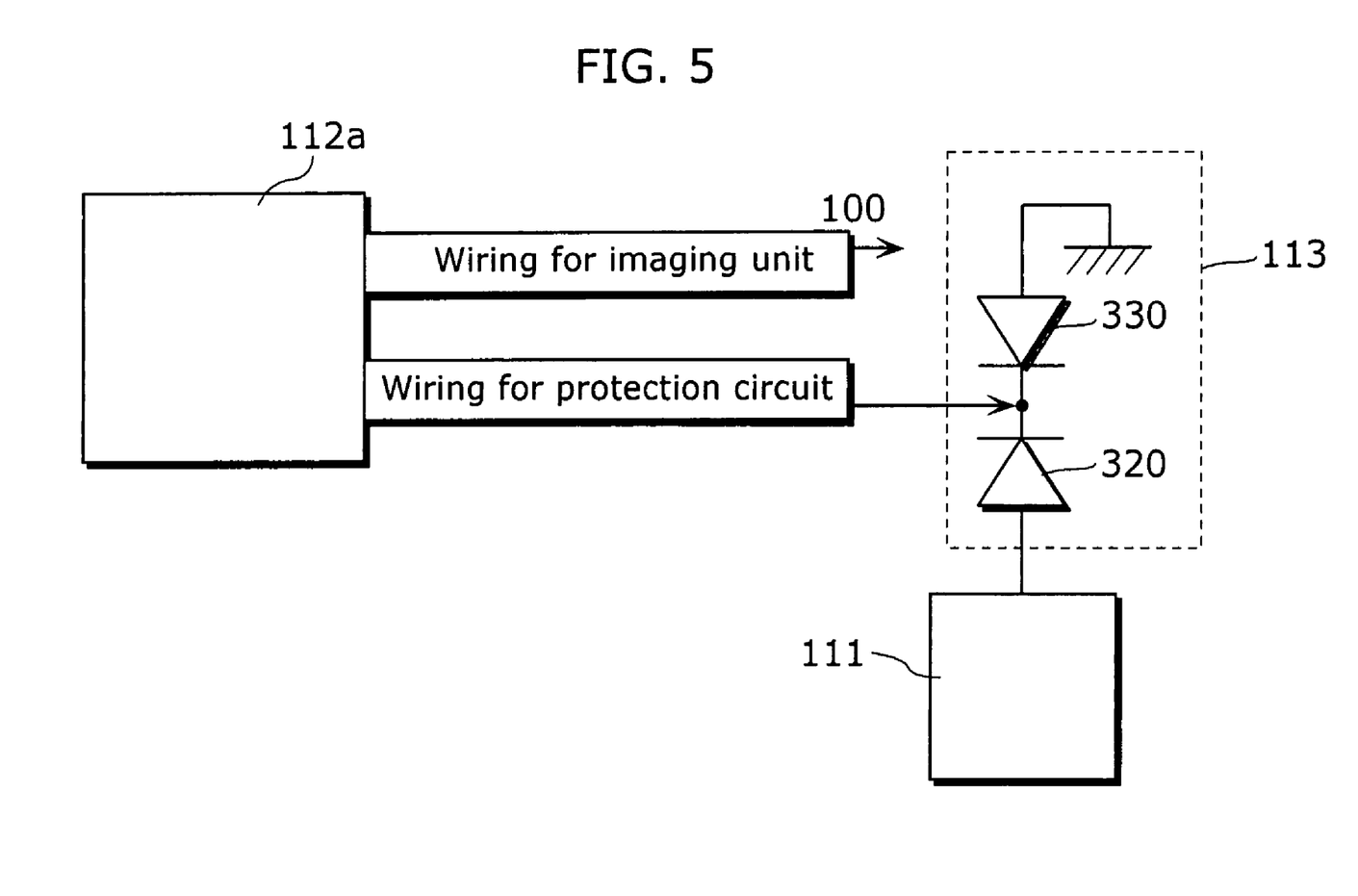
FIG. 5 is a diagram for describing wirings for connecting a first electrode pad 112a with a protection circuit 113 and an imaging unit 100 respectively.

As shown in FIG. 5, the following wirings are separately wired: a wiring for protection circuit for connecting the first electrode pad 112a and the protection circuit 113; and a wiring for imaging unit for connecting the first electrode pad 112a and the imaging unit 100. In other words, two wirings can be drawn from the first electrode pad 112a.

Figure 6:
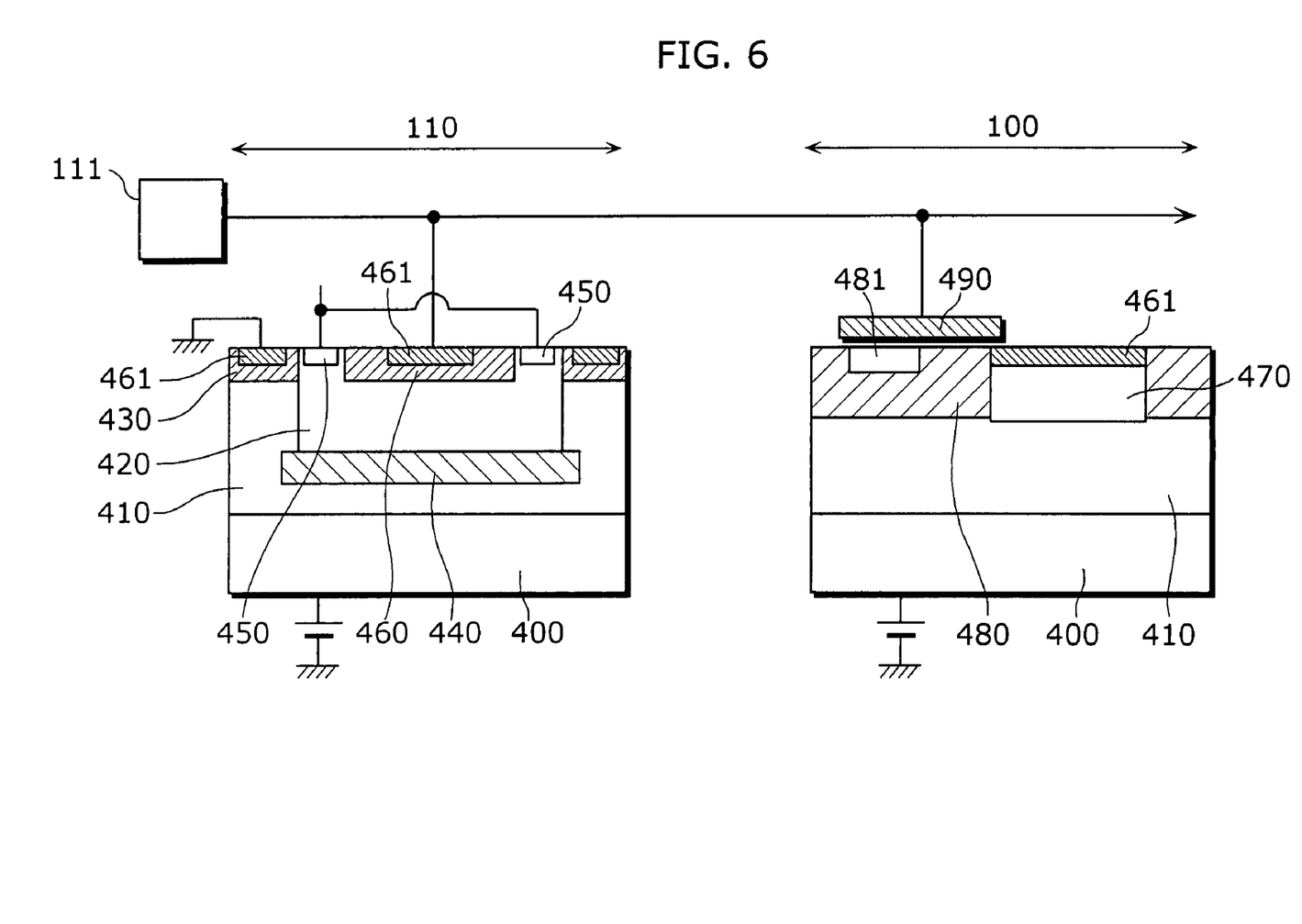
FIG. 6 shows cross-sectional views of the imaging unit 100 (in the periphery of a photodiode), and of the peripheral circuit portion 110 (in the periphery of the protection circuit 113)

FIG. 6 shows cross-sectional views of the imaging unit 100 (in the periphery of the photodiode), and of the peripheral circuit portion 110 (in the periphery of the protection circuit).

In the peripheral circuit portion 110, a p-type well region 410 is formed in an upper part of an n-type silicon substrate 400 that is a semiconductor substrate while an n-type well region 420 and a p-type impurity diffusion region 430 are formed in the surface portion of the p-type well region 410. A $p^+$-type well region 440 is formed below the n-type well region 420 in the p-type well region 410 so that the protection circuit 113 is not affected by the operation of electronic shutter.

In the surface portion of the n-type well region 420, an $n^+$-type impurity diffusion region 450 and a p-type impurity diffusion region 460 are formed. In the surface portion of the p-type impurity diffusion region 460, a $p^+$-type impurity diffusion region 461 is formed. The $p^+$-type impurity diffusion region 461 is also formed in the surface portion of the p-type impurity diffusion region 430. Here, the $p^+$-type impurity diffusion region 461 of the p-type impurity diffusion region 460 becomes an anode while the $n^+$-type impurity diffusion region 450 becomes a cathode, so as to form the diode 330. In this case, a break down voltage of the diode 320 is determined by the impurity concentration of the p-type impurity diffusion region 460 and the $n^+$-type impurity diffusion region 450 as well as the position of the $n^+$-type impurity diffusion region 450 with respect to the p-type impurity diffusion region 460.

In the imaging unit 100, a p-type well region 410 is formed in an upper part of the n-type silicon substrate 400 while an n-type impurity diffusion region 470 and a p-type impurity diffusion region 480 are formed in the surface portion of the p-type well region 410.

In the surface portion of the n-type impurity diffusion region 470, the $p^+$-type impurity diffusion region 461 is formed. Here, the n-type impurity diffusion region 470 and the $p^+$-type impurity diffusion region 461 form a photodiode.

In the surface portion of the p-type impurity diffusion region 480, an n-type transfer channel region 481 is formed. Here, a transfer electrode 490 is formed above the n-type transfer channel region 481 through a gate dielectric film. The gate dielectric film, the n-type transfer channel region 481 and the transfer electrode 490 thus form a vertical CCD.

The following describes, with reference to the cross-sectional views shown in FIGS. 7A to 7E, a method of manufacturing the CCD solid-state imaging device that has the structure as described above. Note that FIGS. 7A to 7E respectively show the cross-sectional view of the periphery of the photodiode in the imaging unit 100 and the periphery of the protection circuit 113 in the periphery circuit portion 110.

Figure 7A:
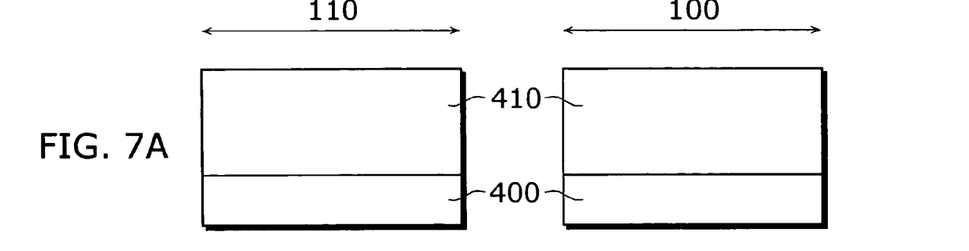
FIGS. 7A, 7B and 7C respectively show cross-sectional views of the imaging unit 100 (in the periphery of the photodiode), and of the peripheral circuit portion 110 (in the periphery of the protection circuit 113), for describing a method of manufacturing the CCD solid-state imaging device according to the embodiment of the present invention.

As shown in FIG. 7A, in the imaging unit 100 and the peripheral circuit portion 110, an n-type silicon substrate 400 is doped with a p-type impurity such as boron so that a p-type well region 410 is formed.

Figure 7B:
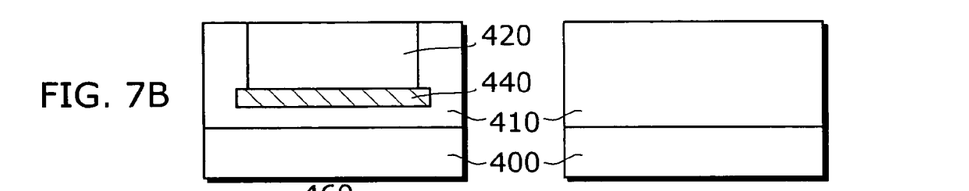

Then, as shown in FIG. 7B, in the peripheral circuit portion 110, the p-type well region 410 is doped with a p-type impurity that has a high concentration, using high energy doping, so as to form a $p^+$-type well region 440. After the formation of the $p^+$-type well region 440, the p-type well region 410 is further doped with an n-type impurity so that an n-type well region 420 is formed. Here, the $p^+$-type well region 440 and the n-type well region 420 are formed using the same mask.

Figure 7C:
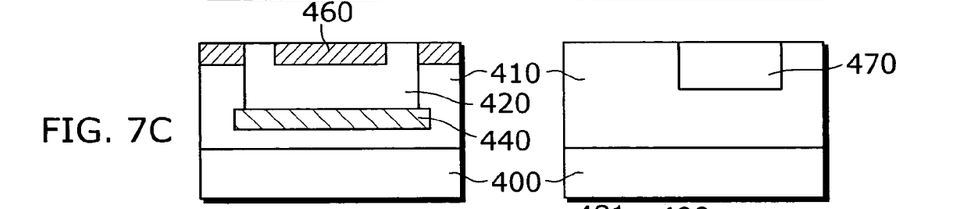

As shown in FIG. 7C, in the peripheral circuit portion 110, the p-type well region 410 and the n-type well region 420 are doped with a p-type impurity so that a p-type impurity diffusion region 460 is formed. In the imaging unit 100, the p-type well region 410 is doped with an n-type impurity so that an n-type impurity diffusion region 470 is formed.

Figure 7D:
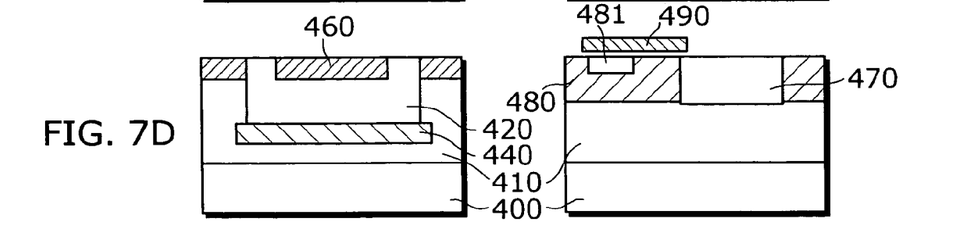
FIG. 7D shows cross-sectional views of the imaging unit 100 (in the periphery of the photodiode), and of the peripheral circuit portion 110 (in the periphery of the protection circuit 113), for describing the method of manufacturing the CCD solid-state imaging device according to the embodiment of the present invention.

As shown in FIG. 7D, in the imaging unit 100, the p-type well region 410 is doped with a p-type impurity so that a p-type impurity diffusion region 480 is formed. The p-type impurity diffusion region 480 is then doped with an n-type impurity so that an n-type transfer channel region 481 is formed. Then, a gate dielectric and a transfer electrode 490 are formed on the n-type transfer channel region 481.

Figure 7E:
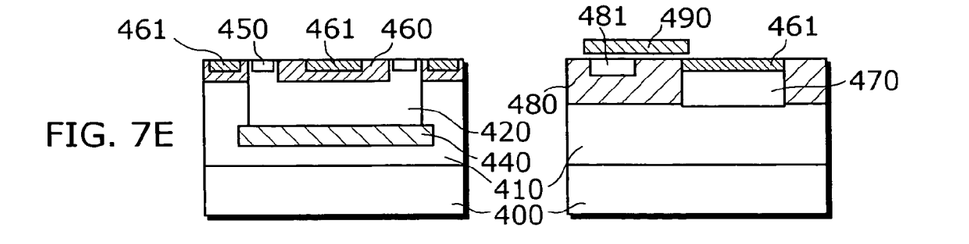
FIG. 7E shows cross-sectional views of the imaging unit 100 (in the periphery of the photodiode), and of the peripheral circuit portion 110 (in the periphery of the protection circuit 113), for describing the method of manufacturing the CCD solid-state imaging device according to the embodiment of the present invention.

Lastly, as shown in FIG. 7E, in the imaging unit 100 and the peripheral circuit portion 110, the n-type impurity diffusion region 470 and the p-type impurity diffusion region 460 are doped with a p-type impurity that has a high concentration, so that a $p^+$-type impurity diffusion region 461 is formed. Then, in the peripheral circuit portion 110, the n-type well region 420 is doped with an n-type impurity so that an $n^+$-type impurity diffusion region 450 is formed.

As described above, the CCD solid-state imaging device of the present embodiment, unlike the conventional CCD solid-state imaging device, discharges the static electricity that has entered the signal input/output electrode pad from the exterior, to the power supply electrode pad, it does not require an electrostatic electrode pad for discharging the static electricity. Therefore, it is possible to reduce, by one, the number of electrode pads, each having a large width of around 80 to 100 μm, and thereby to reduce the planar dimension of the semiconductor substrate (the planar dimension indicated by a dotted line in FIG. 3). The CCD solid-state imaging device of the present embodiment thus realizes miniaturization of camera while maintaining the level of electrostatic damage resistance in the solid-state imaging device. Also, the numbers of electrode pads and wirings in an assembly substrate connected to the solid-state imaging device can be respectively reduced by one, and thereby the planar dimension of the assembly substrate can be reduced. Thus, the CCD solid-state imaging device of the present embodiment can realize further miniaturization of camera.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

Figure 8:
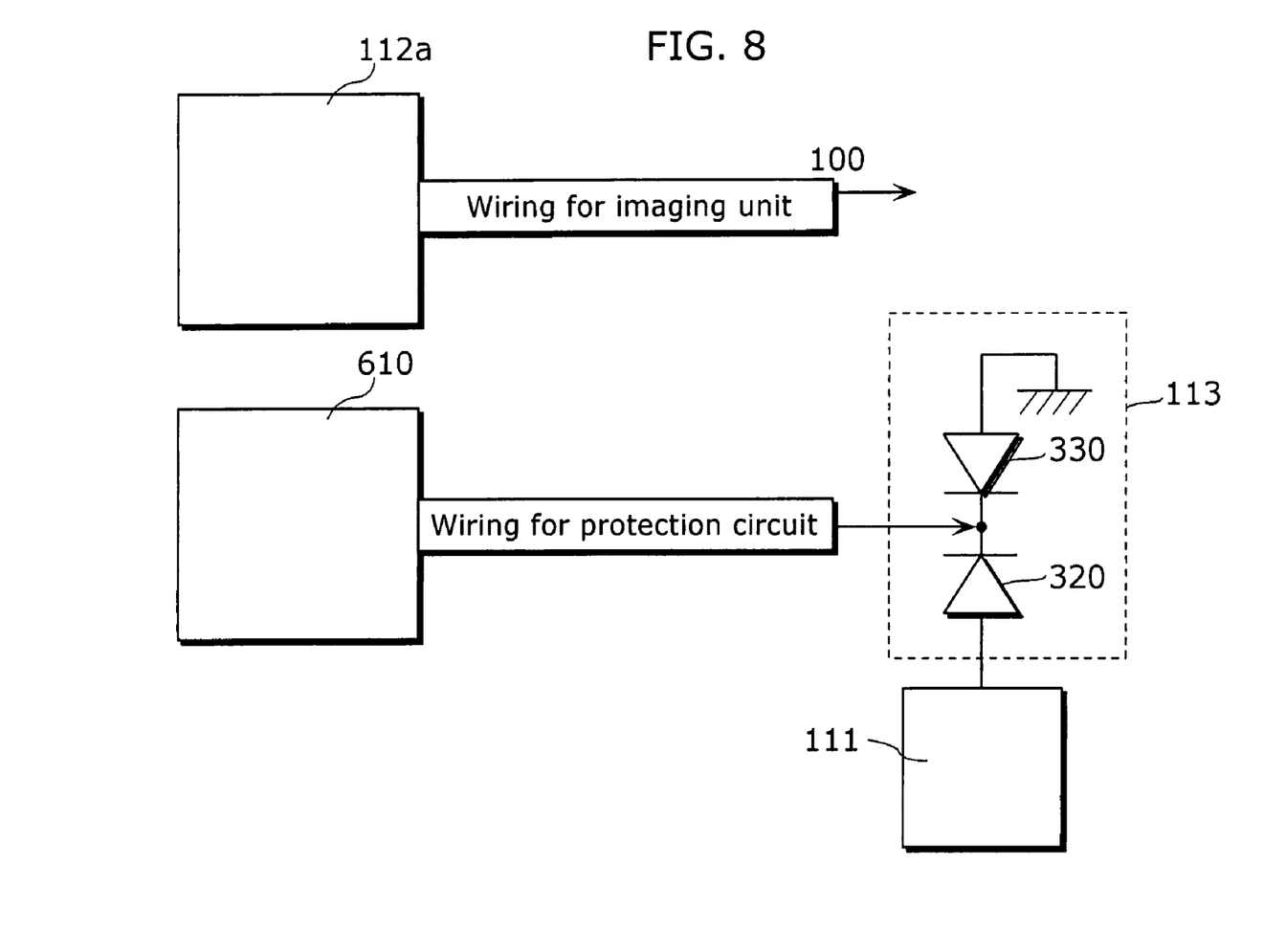
FIG. 8 is a diagram for describing wirings for connecting the electrode pad 112a and the imaging unit 100, and also, the electrostatic electrode pad 610 and the protection circuit 113.

For example, in the above embodiment, it is described that two wirings can be drawn from the first electrode pad 112a as shown in FIG. 5. However, as shown in FIG. 8, an electrostatic electrode pad 610, to which the voltage Vod is provided and from which the static electricity that has entered from the exterior is discharged, may be placed in the peripheral circuit portion 110 together with the electrode pad 112a, and the electrostatic electrode pad 610 and the protection circuit 113 may be connected via a wiring for protection circuit. In this case, two wirings are drawn from an electrode pad that supplies the voltage Vod in the assembly substrate, and are connected to the first electrode pad 112a and the electrostatic electrode pad 610. In this way, it is possible to electrically separate the protection circuit 113 and the imaging unit 100 so that fluctuation in the voltage Vod, which is caused by a diving voltage from the protection circuit 113 to the imaging unit 100, can be prevented.

Figure 9:
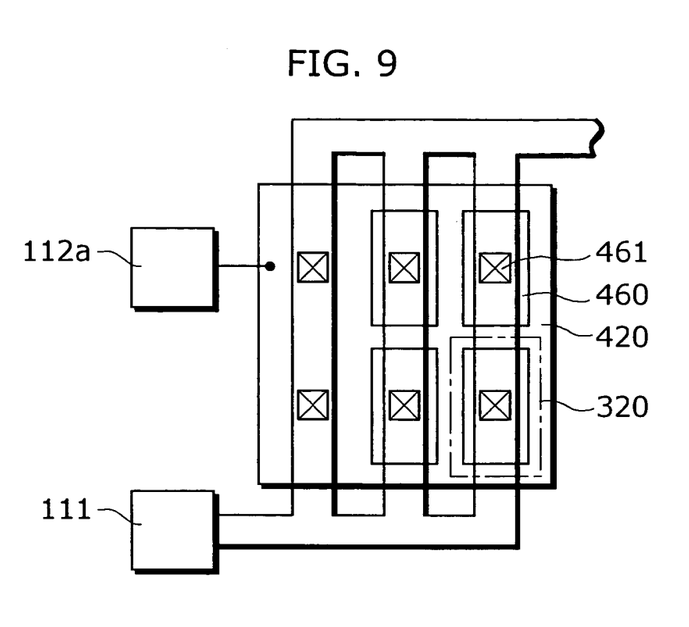
FIG. 9 shows a top view of the periphery circuit portion 110 (in the periphery of the protection circuit 113)

In the above embodiment, it is assumed that the protection circuit 113 has one diode 320, however, it may have plural diodes 320 that are electrically connected in parallel. In this case, plural island-shaped p-type impurity diffusion regions 460 with a width of, for instance, 3 to 5 μm, each having a $p^+$-type impurity diffusion region 461, are formed in the surface portion of the n-type well region 420, as shown in the top view of the peripheral circuit portion 110 (i.e. in the periphery of the protection circuit 113) shown in FIG. 9. This increases the planar dimension of a PN junction and thereby increases an amount of static electricity to be discharged by the protection circuit. It is therefore possible to strengthen the level of electrostatic damage resistance in the solid-state imaging device.

Figure 10A:
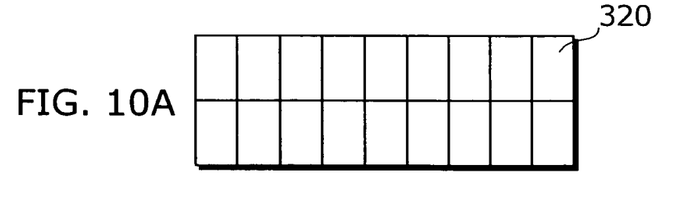
FIGS. 10A, 10B and 10C respectively present a layout diagram of a diode 320 in the protection circuit 113.
Figure 10B:
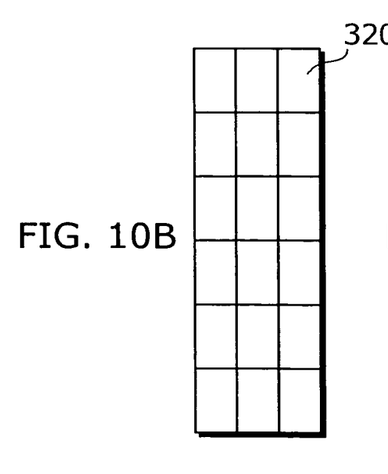
Figure 10C:
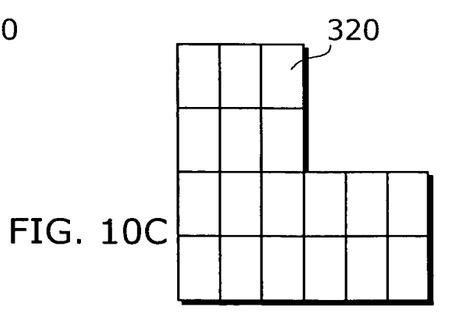

As shown in the layout diagram of the diode 320 in the protection circuit 113 shown in FIGS. 10A to 10C, the arrangement of the diodes 320 can be freely selected, which realizes miniaturization of the solid-state imaging device. In other words, the protection circuit 113 may be formed between the electrode pads or between the wirings by adjusting the arrangement of the diodes 320. There is therefore no need to retain a place for the formation of the protection circuit 113 on the semiconductor substrate, and thus, the planar dimension of the semiconductor substrate can be reduced.

INDUSTRIAL APPLICABILITY

The present invention can be used for the solid-state imaging device, and especially for the CCD solid-state imaging device used for a camera equipped in an electronic endoscope.

What is claimed is:

1. A CCD solid-state imaging device, comprising:
a semiconductor substrate;
an imaging unit formed in said semiconductor substrate, said imaging unit including (i) a photoelectric conversion unit operable to photo-electrically convert incident light into signal charge, said imaging unit being operable to transfer the signal charge generated by said photoelectric conversion unit, and (ii) a transfer electrode;
a signal electrode pad connected to said transfer electrode for supplying a positive voltage pulse and a negative voltage pulse to said transfer electrode;
a power supply electrode pad for supplying a power supply voltage which is equal to or higher than the positive voltage; and
a first diode for protecting said imaging unit,
wherein a cathode of said first diode is connected to said power supply electrode pad, and an anode of said first diode is connected to said signal electrode pad.

2. The CCD solid-state imaging device according to claim 1,
wherein the anode of said first diode is a first P-type impurity region formed by injecting impurity into said semiconductor substrate, and the cathode of said first diode is a first N-type impurity region formed by injecting impurity into said semiconductor substrate.

3. The CCD solid-state imaging device according to claim 2, further comprising a second diode,
wherein a cathode of said second diode is connected to the cathode of said first diode, and an anode of said second diode is connected to ground.

4. The CCD solid-state imaging device according to claim 3,
wherein the anode of said second diode is a second P-type impurity region formed by injecting impurity into said semiconductor substrate, and
the cathode of said second diode is the first N-type impurity region.

5. The CCD solid-state imaging device according to claim 1, further comprising an amplifier transistor formed on said semiconductor substrate,
wherein said amplifier transistor amplifies the transferred signal charge, and
said amplifier transistor is connected to said power supply electrode pad.

6. The CCD solid-state imaging device according to claim 1, further comprising a second diode,
wherein a cathode of said second diode is connected to the cathode of said first diode, and an anode of said second diode is connected to ground.

* * * * *